(12) United States Patent
Qin

(10) Patent No.: US 10,347,631 B2
(45) Date of Patent: Jul. 9, 2019

(54) THIN FILM TRANSISTOR AND METHOD OF MANUFACTURING THE SAME, ARRAY SUBSTRATE, AND DISPLAY DEVICE

(71) Applicant: BOE Technology Group Co., Ltd., Beijing (CN)

(72) Inventor: Wei Qin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/542,136

(22) PCT Filed: Nov. 9, 2016

(86) PCT No.: PCT/CN2016/105209
§ 371 (c)(1),
(2) Date: Jul. 7, 2017

(87) PCT Pub. No.: WO2017/124818
PCT Pub. Date: Jul. 27, 2017

(65) Prior Publication Data
US 2018/0108657 A1    Apr. 19, 2018

(30) Foreign Application Priority Data
Jan. 21, 2016    (CN) .......................... 2016 1 0040536

(51) Int. Cl.
*H01L 27/092*    (2006.01)
*H01L 29/786*    (2006.01)
(Continued)

(52) U.S. Cl.
CPC ...... *H01L 27/092* (2013.01); *H01L 27/14692* (2013.01); *H01L 29/66742* (2013.01); *H01L 29/786* (2013.01); *H01L 29/7869* (2013.01)

(58) Field of Classification Search
CPC . H01L 29/786; H01L 27/092; H01L 29/7869; H01L 29/66742
See application file for complete search history.

(56) References Cited

U.S. PATENT DOCUMENTS

| 8,058,654 B2 | 11/2011 | Miyake et al. |
| 8,158,978 B2 | 4/2012 | Kim et al. |

(Continued)

FOREIGN PATENT DOCUMENTS

| CN | 101521210 A | 9/2009 |
| CN | 101546768 A | 9/2009 |

(Continued)

OTHER PUBLICATIONS

Dec. 4, 2017—(CN) First Office Action Appn 201610040536.5 with English Tran.

(Continued)

*Primary Examiner* — Dung A. Le
(74) *Attorney, Agent, or Firm* — Banner & Witcoff, Ltd.

(57) ABSTRACT

A complementary thin film transistor includes an N-type metal oxide thin film transistor and a P-type metal oxide thin film transistor. A method of manufacturing a complementary thin film transistor is also provided. The method includes forming a complementary thin film transistor including an N-type metal oxide thin film transistor and a P-type metal oxide thin film transistor. An array substrate including the complementary thin film transistor and a display device including the array substrate are further provided.

16 Claims, 7 Drawing Sheets

(51) Int. Cl.
*H01L 27/146* (2006.01)
*H01L 29/66* (2006.01)

(56) References Cited

U.S. PATENT DOCUMENTS

| | | | | |
|---|---|---|---|---|
| 2010/0148825 | A1* | 6/2010 | Park | H01L 27/0207 |
| | | | | 326/121 |
| 2010/0237352 | A1* | 9/2010 | Sele | H01L 27/12 |
| | | | | 257/66 |
| 2011/0104833 | A1 | 5/2011 | Kang et al. | |
| 2013/0264657 | A1 | 10/2013 | Komatani et al. | |
| 2014/0159038 | A1* | 6/2014 | Im | H01L 27/1225 |
| | | | | 257/43 |
| 2017/0301734 | A1* | 10/2017 | Zeng | H01L 21/82 |

FOREIGN PATENT DOCUMENTS

| | | |
|---|---|---|
| CN | 101937875 A | 1/2011 |
| CN | 105470310 A | 4/2016 |
| JP | H05182984 A | 7/1993 |

OTHER PUBLICATIONS

Feb. 15, 2017—(WO) International Search Report and Written Opinion Appn PCT/CN2016/105209 with English Tran.
Aug. 2, 2018—(CN) Second Office Action Appn 201610040536.5 with English Translation.

\* cited by examiner

THIN FILM TRANSISTOR AND METHOD OF MANUFACTURING THE SAME, ARRAY SUBSTRATE, AND DISPLAY DEVICE

The application is a U.S. National Phase Entry of International Application No. PCT/CN2016/105209 filed on Nov. 9, 2016, designating the United States of America and claiming priority to Chinese Patent Application No. 201610040536.5 filed on Jan. 21, 2016. The present application claims priority to and the benefit of the above-identified applications and the above-identified applications are incorporated by reference herein in their entirety.

TECHNICAL FIELD

Embodiments of the present disclosure relate to a thin film transistor and a method of manufacturing the same, an array substrate, and a display device.

BACKGROUND

A complementary thin film transistor (i.e., comprising both an N-type thin film transistor and a P-type thin film transistor) typically adopts low-temperature polysilicon (LTPS) as semiconductor layer material. But, since the process for the low-temperature polysilicon is complicated and has poor controllability and poor uniformity, the low-temperature polysilicon has not been used in a display device having a large area of over 6-generation line.

SUMMARY

At least one embodiment of the present disclosure provides a thin film transistor which is a complementary thin film transistor, wherein the complementary thin film transistor comprises an N-type metal oxide thin film transistor and a P-type metal oxide thin film transistor.

In one embodiment of the present disclosure, the complementary thin film transistor comprises:

a first metal layer comprising a first electrode of the N-type metal oxide thin film transistor and a second electrode of the P-type metal oxide thin film transistor;

a semiconductor layer of the N-type metal oxide thin film transistor and a semiconductor layer of the P-type metal oxide thin film transistor;

a second metal layer comprising a third electrode of the N-type metal oxide thin film transistor and the forth electrode of the P-type metal oxide thin film transistor;

wherein one of the first electrode and the third electrode is a gate electrode, the other of the first electrode and the third electrode is source and drain electrodes, one of the second electrode and the forth electrode is a gate electrode, and the other of the second electrode and the forth electrode is source and drain electrodes.

In one embodiment of the present disclosure, the complementary thin film transistor comprises:

a first metal layer;
a first insulation layer;
a first semiconductor layer;
a spacer layer;
a second semiconductor layer; and
a second metal layer;

wherein one of the first semiconductor layer and the second semiconductor layer is a semiconductor layer of the N-type metal oxide thin film transistor, and the other is a semiconductor layer of the P-type metal oxide thin film transistor.

In one embodiment of the present disclosure, the complementary thin film transistor comprises a second insulation layer positioned between the second metal layer and the spacer layer and between the second metal layer and the second semiconductor layer.

In one embodiment of the present disclosure, the complementary thin film transistor comprises:

a first metal layer;
a first insulation layer;
a first semiconductor layer and a second semiconductor layer provided in the same level;
a second metal layer;

wherein one of the first semiconductor layer and the second semiconductor layer is a semiconductor layer of the N-type metal oxide thin film transistor, and the other is a semiconductor layer of the P-type metal oxide thin film transistor.

In one embodiment of the present disclosure, the complementary thin film transistor further comprises a second insulation layer positioned between the second metal layer and the first semiconductor layer and between the second metal layer and the second semiconductor layer.

In one embodiment of the present disclosure, the N-type metal oxide thin film transistor uses semiconductor material comprises IGZO, IZO or ZON.

In one embodiment of the present disclosure, the P-type metal oxide thin film transistor uses semiconductor material comprises CuO or SnO.

At least one embodiment of the present disclosure further provides a method of manufacturing a complementary thin film transistor, comprising:

forming a complementary thin film transistor, which comprises an N-type metal oxide thin film transistor and a P-type metal oxide thin film transistor.

In one embodiment of the present disclosure, forming the complementary thin film transistor comprises:

forming a first metal layer by a single patterning process, the first metal layer comprising a first electrode of the N-type metal oxide thin film transistor and a second electrode of the P-type metal oxide thin film transistor;

forming a semiconductor layer of the N-type metal oxide thin film transistor and a semiconductor layer of the P-type metal oxide thin film transistor;

forming a second metal layer by a single patterning process, the second metal layer comprising a third electrode of the N-type metal oxide thin film transistor and a fourth electrode of the P-type metal oxide thin film transistor;

wherein one of the first electrode and the third electrode is a gate electrode and the other is source and drain electrodes, and one of the second electrode and the fourth electrode is a gate electrode and the other is source and drain electrodes.

In one embodiment of the present disclosure, forming a semiconductor layer of the N-type metal oxide thin film transistor and a semiconductor layer of the P-type metal oxide thin film transistor comprises:

forming a first semiconductor layer;
forming a spacer layer;
forming a second semiconductor layer;

wherein one of the first semiconductor layer and the second semiconductor layer is the semiconductor layer of the N-type metal oxide thin film transistor and the other is the semiconductor layer of the P-type metal oxide thin film transistor.

In one embodiment of the present disclosure, forming patterns of the semiconductor layers of the N-type metal oxide thin film transistor and the P-type metal oxide thin film transistor comprises:

forming a first oxide semiconductor thin film;

coating a first layer of photoresist on the first oxide semiconductor thin film;

exposing and developing the first layer of photoresist to form a completely maintained region of the first layer of photoresist and a completely removed region of the first layer of photoresist, wherein the completely maintained region of the first layer of photoresist corresponds to a first semiconductor layer and the completely removed region of the first layer of photoresist corresponds to other regions;

removing a portion of the first oxide semiconductor thin film positioned in the completely removed region of the first layer of photoresist to form the first semiconductor layer and maintaining the first layer of photoresist on the first semiconductor layer;

forming a second oxide semiconductor thin film;

peeling off the first layer of photoresist above the first semiconductor layer;

coating a second layer of photoresist on the first semiconductor layer and the second oxide semiconductor thin film;

exposing and developing the second layer of photoresist to form a completely maintained region of the second layer of photoresist and a completely removed region of the second layer of photoresist, the completely maintained region of the second layer of photoresist corresponding to the first semiconductor layer and the second semiconductor layer, and the completely removed region of the second layer of photoresist corresponding to other regions;

removing a portion of the second oxide semiconductor thin film positioned in the removed region of the second layer of photoresist to form the second semiconductor layer;

peeling off the remaining second layer of photoresist and exposing the first semiconductor layer and the second semiconductor layer;

wherein one of the first semiconductor layer and the second semiconductor layer is the semiconductor layer of the N-type metal oxide thin film transistor, and the other is the semiconductor layer of the P-type metal oxide thin film transistor.

In one embodiment of the present disclosure, forming the semiconductor layers of the N-type metal oxide thin film transistor and the P-type metal oxide thin film transistor comprises:

forming a first oxide semiconductor thin film;

coating a first layer of photoresist on the first oxide semiconductor thin film;

exposing and developing the first layer of photoresist to form a completely maintained region of the first layer of photoresist and a completely removed region of the first layer of photoresist, wherein the completely maintained region of the first layer of photoresist corresponds to a first semiconductor layer and the completely removed region of the first layer of photoresist corresponds to other regions;

removing a portion of the first oxide semiconductor thin film positioned in the completely removed region of the first layer of photoresist to form the first semiconductor layer and maintaining the first layer of photoresist on the first semiconductor layer;

forming a second oxide semiconductor thin film;

coating a second layer of photoresist on the second oxide semiconductor thin film;

exposing and developing the second layer of photoresist to form a semi-maintained region of the second layer of photoresist and a completely removed region of the second layer of photoresist, wherein the completely removed region of the second layer of photoresist corresponds to the first semiconductor layer, and the semi-maintained region of the second layer of photoresist corresponds to other regions;

removing a portion of the second oxide semiconductor thin film positioned in the completely removed region of the second layer of photoresist;

peeling off all the remaining first layer of photoresist and second layer of photoresist;

coating a third layer of photoresist on the first semiconductor and the second oxide semiconductor thin film;

exposing and developing the third layer of photoresist to form a completely maintained region of the third layer of photoresist and a completely removed region of the third layer of photoresist, the completely maintained region of the third layer of photoresist corresponding to the first semiconductor layer and the second semiconductor layer, and the completely removed region of the third layer of photoresist corresponding to other regions;

removing a portion of the second oxide semiconductor thin film positioned in the completely removed region of the third layer of photoresist to form the second semiconductor layer;

peeling off the remaining third layer of photoresist and exposing the first semiconductor layer and the second semiconductor layer, so as to form the first semiconductor layer and the second semiconductor layer;

wherein one of the first semiconductor layer and the second semiconductor layer is the semiconductor layer of the N-type metal oxide thin film transistor, and the other is the semiconductor layer of the P-type metal oxide thin film transistor.

In one embodiment of the present disclosure, the N-type metal oxide thin film transistor uses semiconductor material comprising IGZO, IZO or ZON.

In one embodiment of the present disclosure, the P-type metal oxide thin film transistor uses semiconductor material comprising CuO or SnO.

At least one embodiment of the present disclosure further provides an array substrate comprising the thin film transistor as described above.

At least one embodiment of the present disclosure further provides a display device, comprising an array substrate described above.

At least one embodiment of the present disclosure further provides an array substrate comprising the thin film transistor as described above.

At least one embodiment of the present disclosure further provides a display device, comprising an array substrate described above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

Figure 1A:
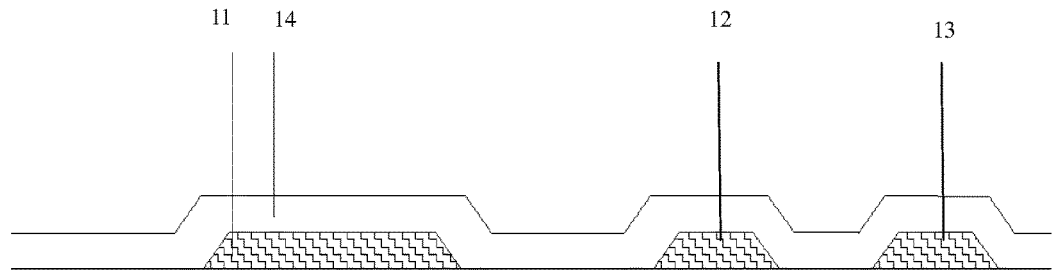
FIG. 1A to FIG. 1F are illustrative views of a method of manufacturing a thin film transistor according to one embodiment of the present disclosure.

REFERENCE NUMERALS 11 electrode of N-type metal oxide thin film transistor;
12 electrode of P-type metal oxide thin film transistor;
13 electrode of P-type metal oxide thin film transistor;
14 first insulation layer;
15A first oxide semiconductor thin film;
15 first semiconductor layer;
16 spacer layer;
17A second oxide semiconductor thin film;
17 second semiconductor layer;
18 second insulation layer;
19 electrode of P-type metal oxide thin film transistor;
20 electrode of N-type metal oxide thin film transistor;
21 electrode of N-type metal oxide thin film transistor;
22 first layer of photoresist;
23 second layer of photoresist;
24 third layer of photoresist.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

At least one embodiment of the present disclosure provides a method of manufacturing a thin film transistor, comprising forming a complementary thin film transistor which comprises an N-type metal oxide thin film transistor and a P-type metal oxide thin film transistor.

The N-type metal oxide thin film transistor uses N-type oxide semiconductor material to form a semiconductor layer, and the so-called N-type oxide semiconductor refers to a reduced-type semiconductor in which the conductivity increases with the reduction atmosphere, such as IGZO, IZO or ZON and the like. The P-type metal oxide thin film transistor uses a P-type oxide semiconductor material to form a semiconductor layer, and the so-called P-type oxide semiconductor refers to an oxidized-type semiconductor in which the conductivity increases with the oxidization atmosphere, such as CuO or SnO and the like.

The complementary thin film transistor using the metal oxide as material for the semiconductor layer has advantages of good uniformity, high mobility and low power consumption, and can be applied to a large area display device. In addition, the complementary thin film transistor using the metal oxide as material for the semiconductor layer has an advantage of having a good compatibility with the a-Si production equipment, thereby reducing the production cost.

To further reduce the production cost, in one embodiment of the present disclosure, forming a complementary thin film transistor comprising:

a step S101 of forming a first metal layer by a single patterning process, the first metal layer comprising a first electrode of an N-type metal oxide thin film transistor and a second electrode of a P-type metal oxide thin film transistor;

a step S102 of forming a semiconductor layer of the N-type metal oxide thin film transistor and a semiconductor layer of the P-type metal oxide thin film transistor;

a step S103 of forming a second metal layer by a single patterning process, the second metal layer comprising a third electrode of the N-type metal oxide thin film transistor and a fourth electrode of the P-type metal oxide thin film transistor;

wherein one of the first electrode and the third electrode is a gate electrode and the other is source and drain electrodes, and one of the second electrode and the fourth electrode is a gate electrode and the other is source and drain electrodes.

In one embodiment of the present disclosure, the first electrode of the N-type metal oxide thin film transistor and the second electrode of the P-type metal oxide thin film transistor are formed by a single patterning process, and the third electrode of the N-type metal oxide thin film transistor and the fourth electrode of the P-type metal oxide thin film transistor are formed by a single patterning process. Two patterning processes can be saved and the production cost can be reduced.

In some other embodiments of the present disclosure, only the first electrode of the N-type metal oxide thin film transistor and the second electrode of the P-type metal oxide thin film transistor are formed by a single patterning process, while the third electrode of the N-type metal oxide thin film transistor and the fourth electrode of the P-type metal oxide thin film transistor are formed by two patterning processes respectively. One patterning processes can be saved and the production cost can be reduced as well.

Alternatively, the third electrode of the N-type metal oxide thin film transistor and the fourth electrode of the P-type metal oxide thin film transistor are formed by a single patterning process, while the first electrode of the N-type metal oxide thin film transistor and the second electrode of the P-type metal oxide thin film transistor are respectively formed by two patterning processes. One patterning processes can be saved and the production cost can be reduced as well.

Embodiments of the present disclosure can form the semiconductor layers of the N-type metal oxide thin film transistor and P-type metal oxide thin film transistor in various ways as exemplified below.

In one embodiment of the present disclosure, forming a semiconductor layer of the N-type metal oxide thin film transistor and a semiconductor layer of the P-type metal oxide thin film transistor comprises:

a step S201 of forming a first semiconductor layer;

a step S202 of forming a spacer layer, which can be made of insulation material such as silicon oxide or silicon nitride;

a step S203 of forming a second semiconductor layer, wherein one of the first semiconductor layer and the second semiconductor layer is a semiconductor layer of the N-type metal oxide thin film transistor and the other is a semiconductor layer of the P-type metal oxide thin film transistor.

In this embodiment, a layer of semiconductor layer is formed at first and then a spacer layer is formed, and then another layer of semiconductor layer is formed. Since there is a spacer layer between the two layers of semiconductor layer, influence of the etching process on the first semiconductor layer can be prevented at the time of forming the pattern of the second semiconductor layer.

A method of manufacturing a thin film transistor according to the present disclosure will be described in detail with reference to FIG. 1A to FIG. 1F and one embodiment of the present disclosure.

Figure 1B:
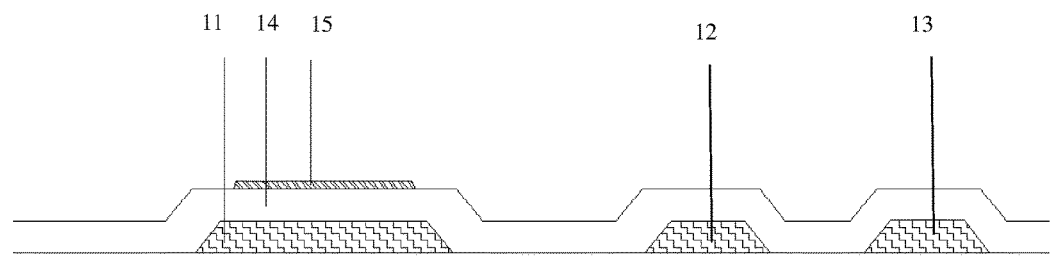
Figure 1C:
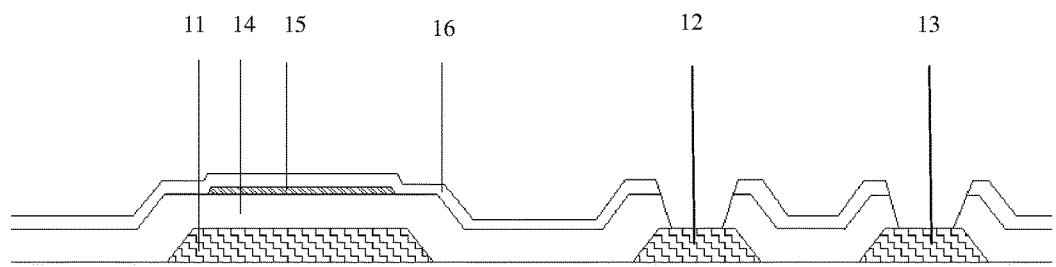
Figure 1D:
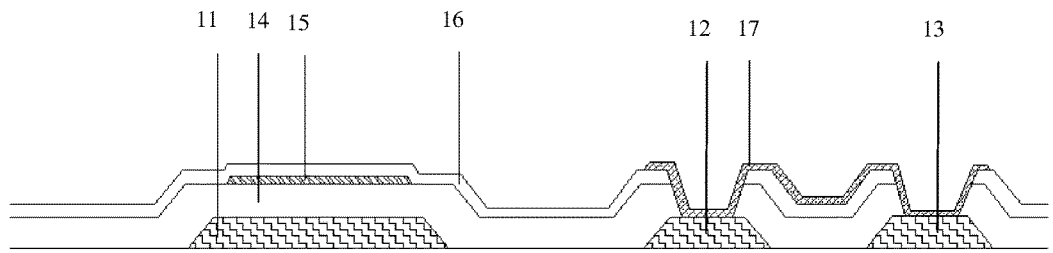
Figure 1E:
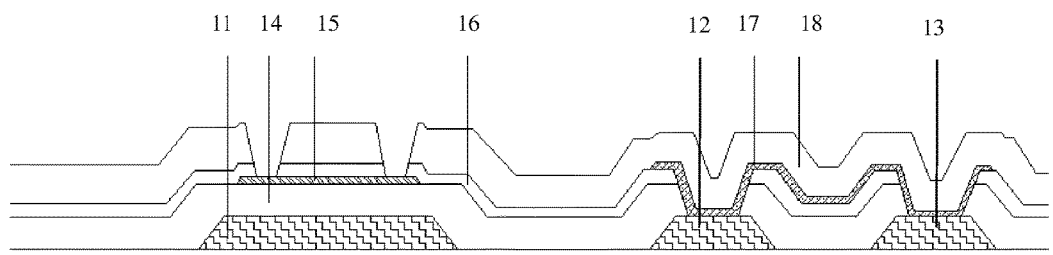
Figure 1F:
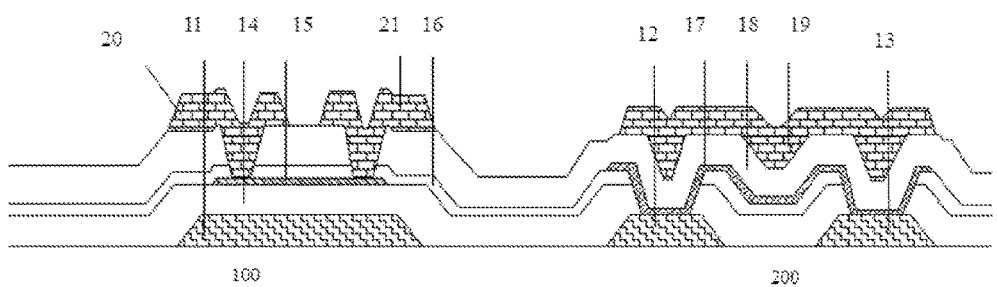

FIG. 1A to FIG. 1F are illustrative views of the method of manufacturing a thin film transistor according to one embodiment of the present disclosure. The manufacturing method comprises:

step S301, forming a first metal layer by a single patterning process and then forming a first insulation layer 14 with reference to FIG. 1A, the first metal layer comprising a first electrode 11 of the N-type metal oxide thin film transistor and a second electrode 12 and 13 of the P-type metal oxide thin film transistor; wherein the first electrode 11 is a gate electrode of the N-type metal oxide thin film transistor, and the second electrode 12 and 13 are a source electrode 12 and a drain electrode 13 of the P-type metal oxide thin film transistor.

step S302, forming a first semiconductor layer 15 with reference to FIG. 1B; in this embodiment, the first semiconductor layer 15 is a semiconductor layer of the N-type metal oxide thin film transistor;

step S303, forming a spacer layer 16 and forming a first via penetrating the spacer layer 16 and the first insulation layer 14 at positions corresponding to the source electrode 12 and the drain electrode 13 of the P-type metal oxide thin film transistor with reference to FIG. 1C; the first insulation layer 14 is a gate insulation layer;

step S304, forming a second semiconductor layer 17 with reference to FIG. 1D; in this embodiment, the second semiconductor layer 17 is a semiconductor layer of the P-type metal oxide thin film transistor, the second semiconductor layer 17 being connected with the source electrode 12 and the drain electrode 13 of the P-type metal oxide thin film transistor through the above-described via;

step S305, forming a second insulation layer 18 and forming a second via penetrating the second insulation layer 18 at positions corresponding to the source electrode and the drain electrode of the N-type metal oxide thin film transistor with reference to FIG. 1E; the second insulation layer 18 is a gate insulation layer;

step S306, forming a second metal layer by a single patterning process with reference to FIG. 1F, the second metal layer comprising a third electrode 20 and 21 of the N-type metal oxide thin film transistor and a fourth electrode 19 of the P-type metal oxide thin film transistor, the third electrode of the N-type metal oxide thin film transistor being connected with the first semiconductor layer 15 through the second via. In the present example, the third electrode is a source electrode 20 and a drain electrode 21 of the N-type metal oxide thin film transistor, and the fourth electrode is a gate electrode 19 of the P-type metal oxide thin film transistor.

By the above process, the complementary metal oxide thin film transistor comprising the N-type metal oxide thin film transistor 100 and the P-type metal oxide thin film transistor 200 is formed.

In another embodiment of the present disclosure, forming patterns of the semiconductor layers of the N-type metal oxide thin film transistor and the P-type metal oxide thin film transistor comprises:

step S401, forming a first oxide semiconductor thin film;

step S402, coating a first layer of photoresist on the first oxide semiconductor thin film;

step S403, exposing and developing the first layer of photoresist to form a completely maintained region of the first layer of photoresist and a completely removed region of the first layer of photoresist, wherein the completely maintained region of the first layer of photoresist corresponds to the first semiconductor layer and the completely removed region of the first layer of photoresist corresponds to other regions;

step S404, removing the first oxide semiconductor thin film in the completely removed region of the first layer of photoresist to form the first semiconductor layer and maintaining the first layer of photoresist on the first semiconductor layer;

step S405, forming a second oxide semiconductor thin film;

step S406, peeling off the first layer of photoresist above the first semiconductor; at this time, a portion of the second oxide semiconductor thin film positioned above the first layer of photoresist is peeled off along with the first layer of photoresist;

step S407, coating a second layer of photoresist on the first semiconductor and the second oxide semiconductor thin film;

step S408, exposing and developing the second layer of photoresist to form a completely maintained region of the second layer of photoresist and a completely removed region of the second layer of photoresist, the completely maintained region of the second layer of photoresist corresponding to the first semiconductor layer and the second semiconductor layer, and the completely removed region of the second layer of photoresist corresponding to other regions;

step S409, removing a portion of the second oxide semiconductor thin film positioned in the removed region of the second layer of photoresist to form the second semiconductor layer;

step S410, peeling off the remaining second layer of photoresist and exposing the first semiconductor layer and the second semiconductor layer;

wherein one of the first semiconductor layer and the second semiconductor layer is the semiconductor layer of the N-type metal oxide thin film transistor, and the other is the semiconductor layer of the P-type metal oxide thin film transistor.

In the embodiment of the present disclosure, it is not necessary to provide a spacer layer between the first semiconductor layer and the second semiconductor layer. Thus, the thin film transistor has a reduced thickness, and when the second semiconductor layer is prepared, the etching process would not affect the first semiconductor layer.

A method of manufacturing a thin film transistor according to the present disclosure will be described in detail with reference to FIG. 2A to FIG. 2J and another embodiment of the present disclosure.

Figure 2A:
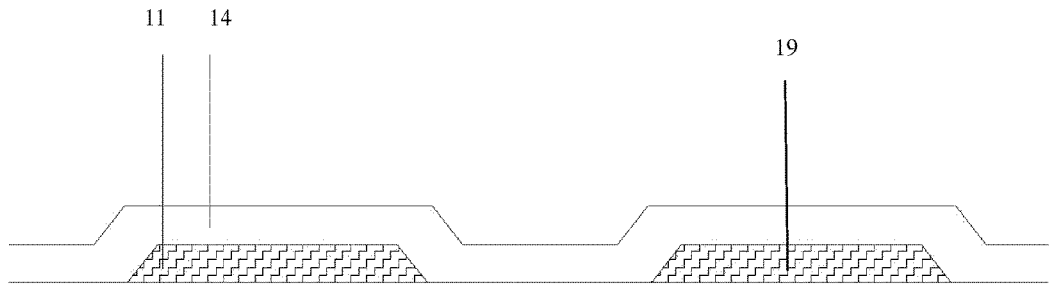
FIG. 2A to FIG. 2J are illustrative views of a method of manufacturing a thin film transistor according to another embodiment of the present disclosure.
Figure 2B:
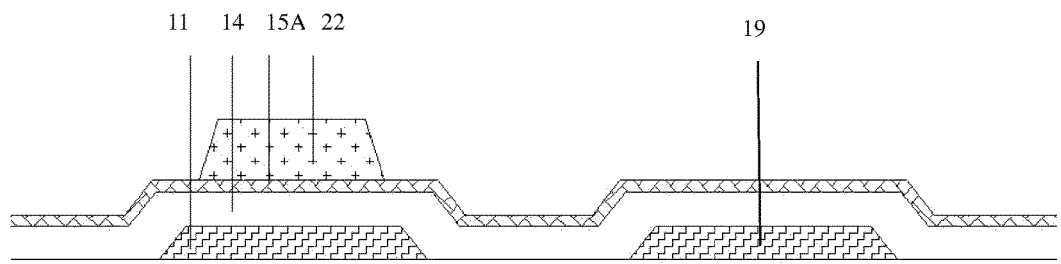
Figure 2C:
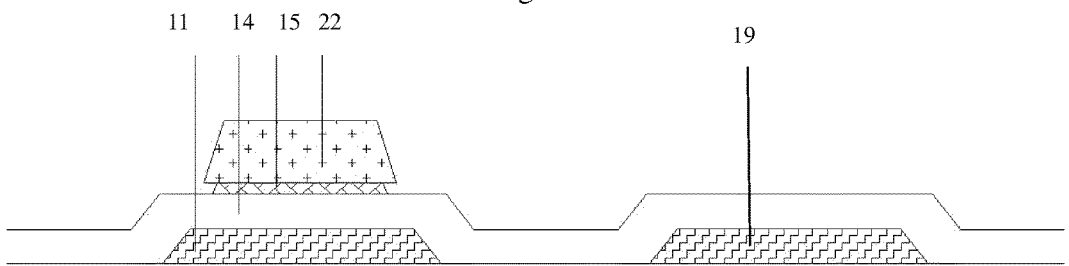
Figure 2D:
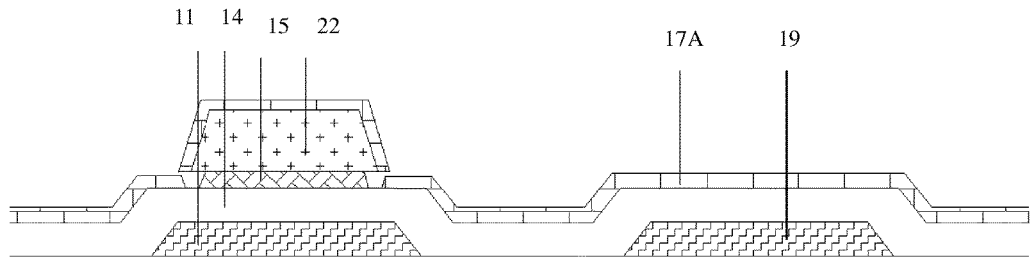
Figure 2E:
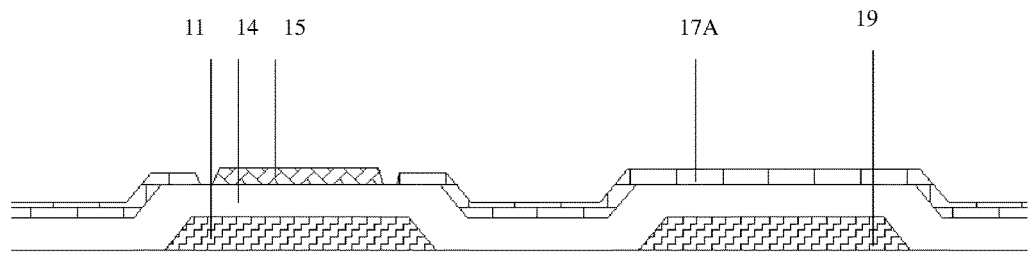
Figure 2F:
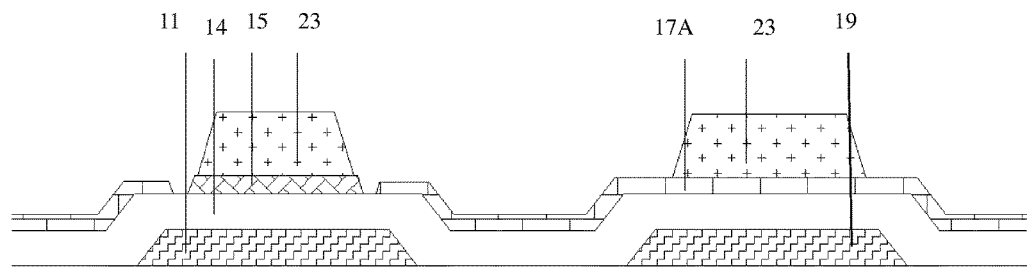
Figure 2G:
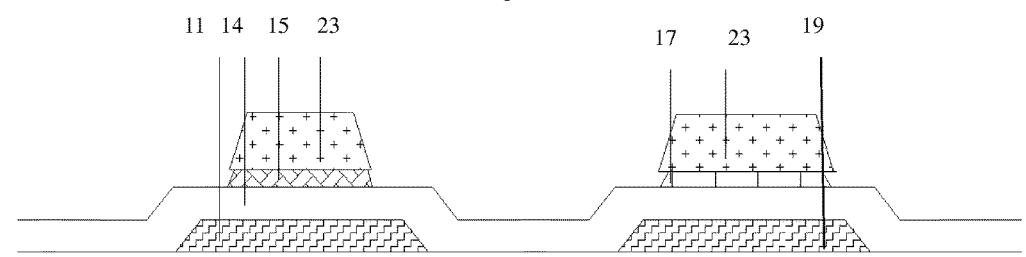
Figure 2H:
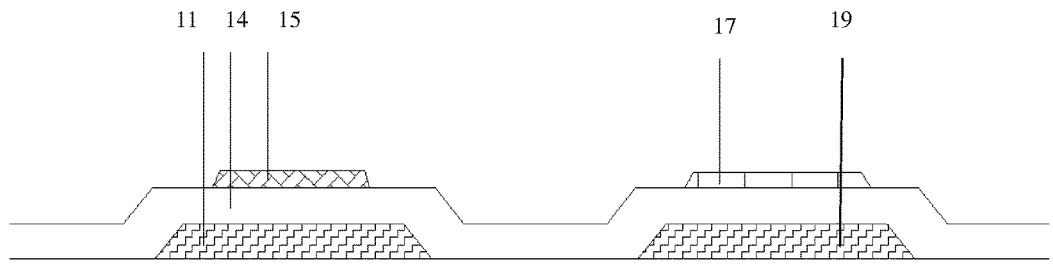

With reference to FIG. 2A to FIG. 2J, which are illustrative views of the method of manufacturing a thin film transistor according to another embodiment of the present disclosure, the manufacturing method comprises:

step S501, forming a first metal layer by a single patterning process and then forming a first insulation layer 14 with reference to FIG. 2A, the first metal layer comprising a first electrode 11 of the N-type metal oxide thin film transistor and a second electrode 19 of the P-type metal oxide thin film transistor, the first insulation layer 14 being a gate insulation layer; for example, the first electrode 11 is a gate electrode of the N-type metal oxide thin film transistor, and the second electrode 19 is a gate electrode of the P-type metal oxide thin film transistor.

step S502, forming a first oxide semiconductor thin film 15A; coating a first layer of photoresist 22 on the first oxide semiconductor thin film 15A, exposing and developing the first layer of photoresist 22 to form a completely maintained region of the first layer of photoresist and a completely removed region of the first layer of photoresist, with reference to FIG. 2B, wherein the completely maintained region of the first layer of photoresist corresponds to the first semiconductor layer and the completely removed region of the first layer of photoresist corresponds to other regions;

step S503, removing the first oxide semiconductor thin film in the completely removed region of the first layer of photoresist by etching process, forming the first semiconductor layer 15 and maintaining the first layer of photoresist 22 on the first semiconductor layer 15 with reference to FIG. 2C; in this embodiment, the first semiconductor layer 15 is a semiconductor layer of the N-type metal oxide thin film transistor;

step S504, forming a second oxide semiconductor thin film 17A with reference to FIG. 2D;

step S505, peeling off the first layer of photoresist 22 above the first semiconductor 15 with reference to FIG. 2E, wherein a portion of the second oxide semiconductor thin film 17A positioned on the first layer of photoresist 22 is peeled off at the same time;

step S506, coating a second layer of photoresist 23 on the first semiconductor 15 and the second oxide semiconductor thin film 17A, exposing and developing the second layer of photoresist 23 to form a completely maintained region of the second layer of photoresist and a completely removed region of the second layer of photoresist with reference to FIG. 2F, the completely maintained region of the second layer of photoresist corresponding to the first semiconductor layer 15 and the second semiconductor layer, and the completely removed region of the second layer of photoresist corresponding to other regions;

step S507, removing a portion of the second oxide semiconductor thin film 17A positioned in the removed region of the second layer of photoresist by etching process so as to form the second semiconductor layer 17 with reference to FIG. 2G; in this embodiment, the second semiconductor layer 17 is a semiconductor layer of the P-type metal oxide thin film transistor;

step S508, peeling off the remaining second layer of photoresist 23 and exposing the first semiconductor layer 15 and the second semiconductor layer 17 with reference to FIG. 2H.

Figure 2I:
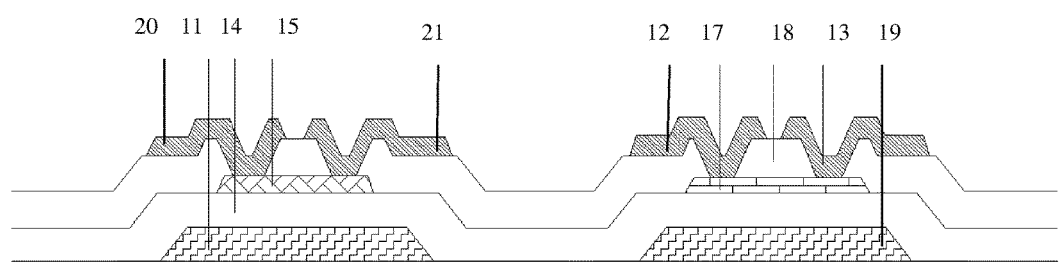

When the thin film transistor is a thin film transistor of etch-stop layer (ESL) structure, the method of the above embodiments of the present disclosure further comprises:

step S5091, with reference to FIG. 2I, forming a second insulation layer 18, and forming a first via penetrating the second insulation layer 18 at positions corresponding to the source electrode and the drain electrode of the P-type metal oxide thin film transistor, forming a second via penetrating the second insulation layer 18 at positions corresponding to the source electrode and the drain electrode of the N-type metal oxide thin film transistor; and then forming a second metal layer by a single patterning process, the second metal layer comprising a third electrode 20 and 21 of the N-type metal oxide thin film transistor and a fourth electrode 12 and 13 of the P-type metal oxide thin film transistor, the third electrode 20 and 21 of the N-type metal oxide thin film transistor being connected with the pattern of the first semiconductor layer 15 through the second via; the fourth electrode 12 and 13 of the P-type metal oxide thin film transistor being connected with the second semiconductor layer 17 through the first via. For example, the third electrode 20 and 21 is a source electrode 20 and a drain electrode 21 of the N-type metal oxide thin film transistor, and the fourth electrode 12 and 13 is a source electrode 12 and a drain electrode 13 of the P-type metal oxide thin film transistor.

Figure 2J:
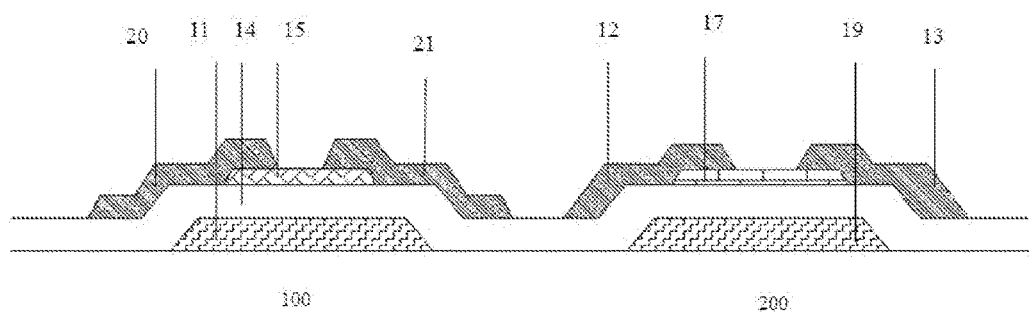

When the thin film transistor is a thin film transistor of back-channel etching (BCE) structure, the method of the above embodiments of the present disclosure further comprises:

step S5092, with reference to FIG. 2J, forming a second metal layer by a single patterning process, the second metal layer comprising a third source 20 and 21 of the N-type metal oxide thin film transistor and a fourth electrode 12 and a 13 of the P-type metal oxide thin film transistor, the third electrode 20 and 21 of the N-type metal oxide thin film transistor being connected with the first semiconductor layer 15 through the second via; the fourth electrode 12 and 13 of the P-type metal oxide thin film transistor being connected with the second semiconductor layer 17 through the first via. For example, the third electrode 20 and 21 is a source electrode 20 and a drain electrode 21 of the N-type metal oxide thin film transistor, and the fourth electrode 12 and 13 is a source electrode 12 and a drain electrode 13 of the P-type metal oxide thin film transistor.

By the above process, a complementary metal oxide thin film transistor comprising a an N-type metal oxide thin film transistor and a P-type metal oxide thin film transistor is formed.

In another embodiment of the present disclosure, forming patterns of the semiconductor layers of the N-type metal oxide thin film transistor and the P-type metal oxide thin film transistor comprises:

step S601, forming a first oxide semiconductor thin film;

step S602, coating a first layer of photoresist on the first oxide semiconductor thin film;

step S603, exposing and developing the first layer of photoresist to form a completely maintained region of the first layer of photoresist and a completely removed region of the first layer of photoresist, wherein the completely maintained region of the first layer of photoresist corresponds to the first semiconductor layer and the completely removed region of the first layer of photoresist corresponds to other regions;

step S604, removing a portion of the first oxide semiconductor thin film in the completely removed region of the first layer of photoresist to form the first semiconductor layer and maintaining the first layer of photoresist on the first semiconductor layer;

step S605, forming a second oxide semiconductor thin film;

step S606, coating a second layer of photoresist on the second oxide semiconductor thin film;

step S607, exposing and developing the second layer of photoresist to form a semi-maintained region of the second layer of photoresist and a completely removed region of the second layer of photoresist, wherein the completely removed region of the second layer of photoresist corresponds to the first semiconductor layer, and the semi-maintained region of the second layer of photoresist corresponds to other regions;

step S608, removing the second oxide semiconductor thin film in the completely removed region of the second layer of photoresist;

step S609, peeling off all of the remaining first layer of photoresist and the remaining second layer of photoresist;

step S610, coating a third layer of photoresist on the first semiconductor and the second oxide semiconductor thin film;

step S611, exposing and developing the third layer of photoresist to form a completely maintained region of the third layer of photoresist and a completely removed region of the third layer of photoresist, the completely maintained region of the third layer of photoresist corresponding to the first semiconductor layer and the second semiconductor layer, and the completely removed region of the third layer of photoresist corresponding to other regions;

step S612, removing a portion of the second oxide semiconductor thin film positioned in the completely removed region of the third layer of photoresist to form the second semiconductor layer;

step S613, peeling off the remaining third layer of photoresist and exposing the first semiconductor layer and the second semiconductor layer;

wherein one of the first semiconductor layer and the second semiconductor layer is the semiconductor layer of the N-type metal oxide thin film transistor, and the other is the semiconductor layer of the P-type metal oxide thin film transistor.

In the embodiment of the present disclosure, it is not necessary to provide a spacer layer between the first semiconductor layer and the second semiconductor layer. Thus, the thin film transistor has a reduced thickness, and when the second semiconductor layer is prepared, the etching process thereof would not affect the first semiconductor layer.

A method of manufacturing a thin film transistor according to the present disclosure will be described in detail with reference to FIG. 3A to FIG. 3F and yet another embodiment of the present disclosure.

Figure 3A:
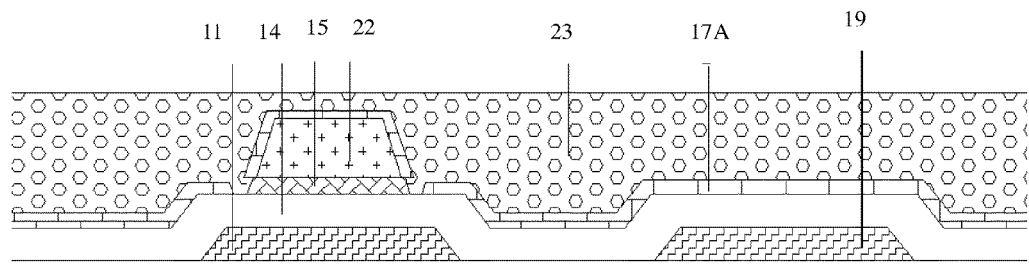
FIG. 3A to FIG. 3F are illustrative views of a method of manufacturing a thin film transistor according to yet another embodiment of the present disclosure.
Figure 3B:
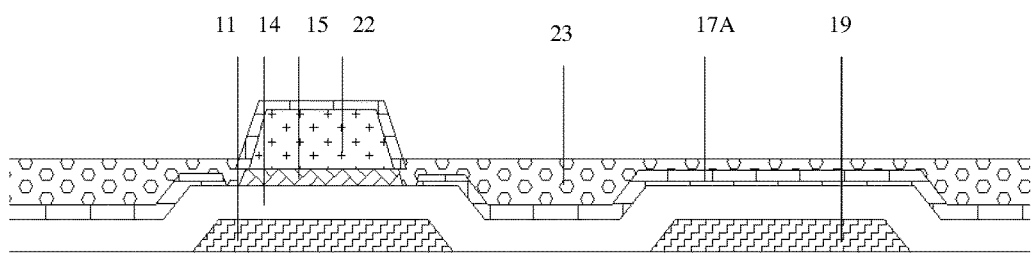
Figure 3C:
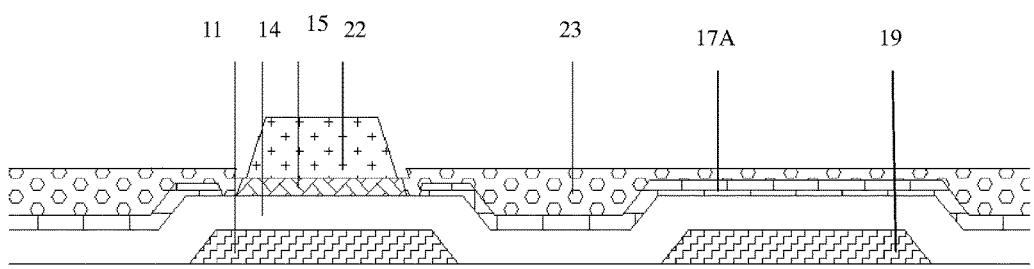
Figure 3D:
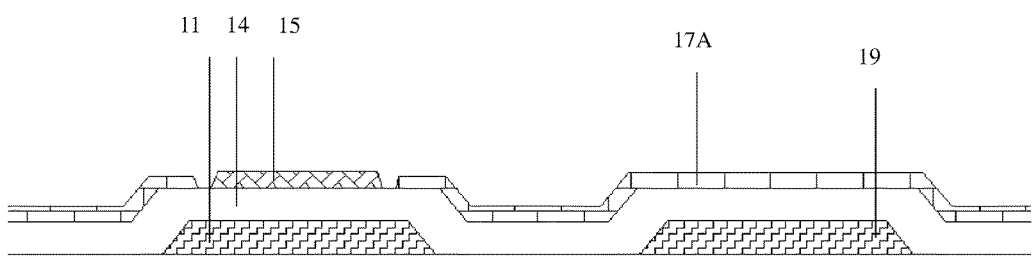
Figure 3E:
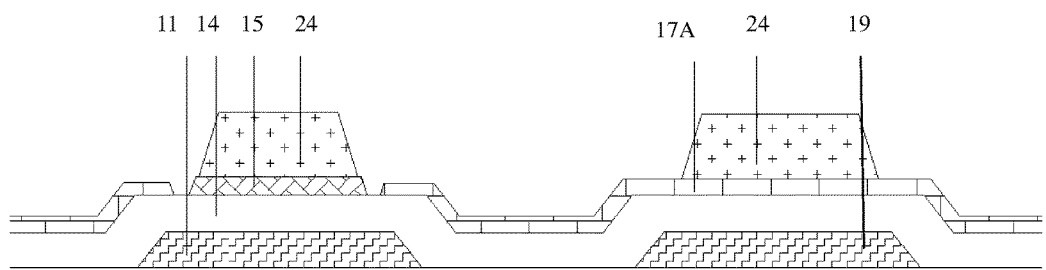
Figure 3F:
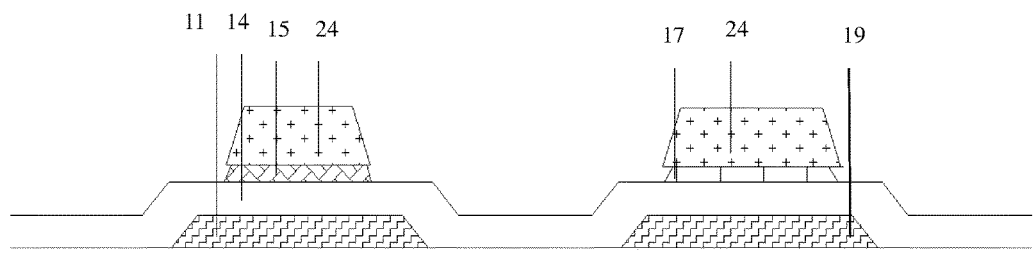

With reference to FIG. 3A to FIG. 3F, which are illustrative views of the method of manufacturing a thin film transistor according to the third embodiment of the present disclosure, the manufacturing method comprises:

Step S701 to Step S704, same as step S501 to step S504, with reference to FIG. 2A to FIG. 2D, of forming a gate electrode 11 of the N-type metal oxide thin film transistor and a gate electrode 19 of the P-type metal oxide thin film transistor, a first insulation layer 14, and a first semiconductor layer 15, and maintaining the first layer of photoresist 22 on the first semiconductor layer 15; and then forming a second oxide semiconductor thin film 17A; in this embodiment, the first semiconductor layer 15 is a semiconductor layer of the N-type metal oxide thin film transistor;

Step S705, coating a second layer of photoresist 23 on the second oxide semiconductor thin film 17A with reference to FIG. 3A;

Step S706, exposing and developing the second layer of photoresist 23 to form a semi-maintained region of the second layer of photoresist and a completely removed region of the second layer of photoresist with reference to FIG. 3B, wherein the completely removed region of the second layer of photoresist corresponds to the first semiconductor layer, and the semi-maintained region of the second layer of photoresist corresponds to other regions;

Step S707, removing a portion of the second oxide semiconductor thin film 17A positioned in the completely removed region of the second layer of photoresist by etching process with reference to FIG. 3C;

Step S708, peeling off all of the remaining first layer of photoresist 22 and the remaining second layer of photoresist 23 with reference to FIG. 3D;

Step S709, with reference to FIG. 3E, coating a third layer of photoresist 24 on the first semiconductor 15 and the second oxide semiconductor thin film 17A; exposing and developing the third layer of photoresist 24 to form a completely maintained region of the third layer of photoresist and a completely removed region of the third layer of photoresist, the completely maintained region of the third layer of photoresist corresponding to the first semiconductor layer 15 and the second semiconductor layer, and the completely removed region of the third layer of photoresist corresponding to other regions;

Step S710, with reference to FIG. 3F, removing a portion of the second oxide semiconductor thin film 17A positioned in the removed region of the third layer of photoresist to form the second semiconductor layer 17; in this embodiment, the second semiconductor layer 17 is a semiconductor layer of the P-type metal oxide thin film transistor;

Step S711, peeling off the remaining third layer of photoresist 24 and exposing the first semiconductor layer 15 and the second semiconductor layer 17; the structure formed after peeling is illustrated in FIG. 2H.

When the thin film transistor is a thin film transistor of etch-stop layer (ESL) structure, the method of the above embodiments of the present disclosure further comprises:

step S7121, with reference to FIG. 2I, forming a second insulation layer 18, and forming a first via penetrating the second insulation layer 18 at positions corresponding to the source electrode and the drain electrode of the P-type metal oxide thin film transistor, forming a second via penetrating the second insulation layer 18 at positions corresponding to the source electrode and the drain electrode of the N-type metal oxide thin film transistor; and then forming a second metal layer by a single patterning process, the second metal layer comprising a source electrode 20 and a drain electrode 21 of the N-type metal oxide thin film transistor and a source electrode 12 and a drain electrode 13 of the P-type metal oxide thin film transistor, the source electrode 20 and the drain electrode 21 of the N-type metal oxide thin film transistor being connected with the first semiconductor layer 15 through the second via; the source electrode 12 and the drain electrode 13 of the P-type metal oxide thin film transistor being connected with the second semiconductor layer 17 through the first via.

When the thin film transistor is a thin film transistor of back-channel etching (BCE) structure, the method of the above embodiments of the present disclosure further comprises:

step S7122, with reference to FIG. 2J, forming a second metal layer by a single patterning process, the second metal layer comprising a source electrode 20 and a drain electrode 21 of the N-type metal oxide thin film transistor and a source electrode 12 and a drain electrode 13 of the P-type metal oxide thin film transistor, the source electrode 20 and the drain electrode 21 of the N-type metal oxide thin film transistor being connected with the first semiconductor layer 15 through the second via; the source electrode 12 and the drain electrode 13 of the P-type metal oxide thin film transistor being connected with the second semiconductor layer 17 through the first via.

By the above step, a complementary metal oxide thin film transistor comprising an N-type metal oxide thin film transistor and a P-type metal oxide thin film transistor is formed.

In each of the above embodiments, the first metal layer and the second metal layer can be made of metal or metal alloy such as copper, aluminum, molybdenum or the like. The gate insulation layer can be made of insulation material such as silicon nitride, silicon oxide or the like.

At least one embodiment of the present disclosure further provides a thin film transistor which is a complementary thin film transistor comprising an N-type metal oxide thin film transistor and a P-type metal oxide thin film transistor.

In one embodiment of the present disclosure, the complementary thin film transistor comprises:

a first metal layer comprising a first electrode of the N-type metal oxide thin film transistor and a second electrode of the P-type metal oxide thin film transistor;

a semiconductor layer of the N-type metal oxide thin film transistor and a semiconductor layer of the P-type metal oxide thin film transistor;

a second metal layer comprising a third electrode of the N-type metal oxide thin film transistor and a fourth electrode of the P-type metal oxide thin film transistor;

wherein one of the first electrode and the third electrode is a gate electrode and the other is source and drain electrodes, and one of the second electrode and the fourth electrode is a gate electrode and the other is source and drain electrodes.

In an embodiment of the present disclosure, the complementary thin film transistor comprises:

a first metal layer;
a first insulation layer;
a first semiconductor layer;
a spacer layer;
a second semiconductor layer, and
a second metal layer;

wherein one of the first semiconductor layer and the second semiconductor layer is a semiconductor layer of the N-type metal oxide thin film transistor, and the other is a semiconductor layer of the P-type metal oxide thin film transistor.

In the thin film transistor of the present embodiment, since there is a spacer layer between the two layers of semiconductor layer, an influence on the first layer of semiconductor layer by the etching process at the time of forming the second layer of the semiconductor layer can be prevented.

In some embodiments of the present disclosure, the above-described complementary thin film transistor can further comprise:

a second insulation layer positioned between the second metal layer and the spacer layer and between the second metal layer and the second semiconductor layer.

The two thin film transistors in above-described complementary thin film transistor can be the following combinations: a bottom gate type thin film transistor and a top gate type thin film transistor, a bottom gate type thin film transistor and a bottom gate type thin film transistor, a top gate type thin film transistor and a top gate type thin film transistor.

In another embodiment of the present disclosure, the complementary thin film transistor comprises:

a first metal layer;
a first insulation layer;
a first semiconductor layer and a second semiconductor layer provided in the same level;
a second metal layer;

wherein one of the first semiconductor layer and the second semiconductor layer is a semiconductor layer of the N-type metal oxide thin film transistor, and the other is a semiconductor layer of the P-type metal oxide thin film transistor.

In the thin film transistor according to the embodiment of the present disclosure, it is not necessary to provide a spacer layer between the first semiconductor layer and the second semiconductor layer, which reduces the thickness of the thin film transistor.

In some embodiments of the present disclosure, the above-described complementary thin film transistor can further comprise:

a second insulation layer positioned between the second metal layer and the first semiconductor layer and between the second metal layer and the second semiconductor layer.

In each of the above embodiments, the semiconductor material used in the N-type metal oxide thin film transistor comprises IGZO, IZO or ZON.

In each of the above embodiments, the semiconductor material used in the P-type metal oxide thin film transistor comprises CuO or SnO.

The thin film transistor can be a thin film transistor of the type of etch-stop layer structure or can be a thin film transistor of the type of back-channel etching structure.

At least one embodiment of the present disclosure further provides an array substrate comprising the above-described thin film transistor.

At least one embodiment of the present disclosure further provides a display device comprising the above-described array substrate. The display device can be a liquid crystal display device (LCD) or an organic light emitting diode (OLED) display device, or of course can be a display device of other type.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201610040536.5 filed on Jan. 21, 2016, the disclosure of which is hereby entirely incorporated by reference as a part of the present disclosure.

The invention claimed is:

1. A complementary thin film transistor, comprising an N-type metal oxide thin film transistor having a first semiconductor layer, and a P-type metal oxide thin film transistor having a second semiconductor layer, wherein the complementary thin film transistor further comprises a spacer between the first semiconductor layer and the second semiconductor layer, and the spacer is made of silicon oxide or silicon nitride, the complementary thin film transistor further comprising:

a first metal layer comprising: a first electrode of the N-type metal oxide thin film transistor and a second electrode of the P-type metal oxide thin film transistor; and a second metal layer comprising, a third electrode of the N-type metal oxide thin film transistor and a fourth electrode of the P-type metal oxide thin film transistor, wherein one of the first electrode and the third electrode is a gate electrode and the other is a source electrode and a drain electrode, and one of the second electrode and the fourth electrode is a gate electrode and the other is a source electrode and a drain electrode.

2. The complementary thin film transistor according to claim 1, wherein the complementary thin film transistor comprises a first insulation layer covering the first metal layer.

3. The complementary thin film transistor according to claim 2, wherein the complementary thin film transistor further comprises:

a second insulation layer positioned between the second metal layer and the spacer and between the second metal layer and the second semiconductor layer.

4. A complementary thin film transistor, comprising:

an N-type metal oxide thin film transistor having a first semiconductor layer;

a P-type metal oxide thin film transistor having a second semiconductor layer, a first metal layer comprising: a first electrode of the N-type metal oxide thin film transistor and a second electrode of the P-type metal oxide thin film transistor;
a second metal layer comprising: a third electrode of the N-type metal oxide thin film transistor and a fourth electrode of the P-type metal oxide thin film transistor,
wherein one of the first electrode and the third electrode is a gate electrode and the other is a source electrode and a drain electrode, and one of the second electrode and the fourth electrode is a gate electrode and the other is a source electrode and a drain electrode; and
a first insulation layer,
wherein the first semiconductor layer and the second semiconductor layer are provided in a same level.

5. The complementary thin film transistor according to claim 4, wherein the complementary thin film transistor further comprises:
a second insulation layer positioned between the second metal layer and the first semiconductor layer and between the second metal layer and the second semiconductor layer.

6. The complementary thin film transistor according to claim 1, wherein the N-type metal oxide thin film transistor uses a semiconductor material comprising IGZO, IZO or ZON.

7. The complementary thin film transistor according to claim 1, wherein the P-type metal oxide thin film transistor uses a semiconductor material comprising CuO or SnO.

8. A method of manufacturing a complementary thin film transistor, comprising:
forming the complementary thin film transistor, which comprises an N-type metal oxide thin film transistor having a first semiconductor layer and a P-type metal oxide thin film transistor having a second semiconductor layer,
wherein the method further comprises forming a spacer of silicon oxide or silicon nitride after forming the first semiconductor layer and prior to forming the second semiconductor layer,
wherein forming the complementary thin film transistor comprises:
forming a first metal layer by a single patterning process, the first metal layer comprising a first electrode of the N-type metal oxide thin film transistor and a second electrode of the P-type metal oxide thin film transistor;
forming a second metal layer by a single patterning process, the second metal layer comprising a third electrode of the N-type metal oxide thin film transistor and a fourth electrode of the P-type metal oxide thin film transistor; and
wherein one of the first electrode and the third electrode is a gate electrode and the other is a source and a drain electrode, and one of the second electrode and the fourth electrode is a gate electrode and the other is a source electrode and a drain electrode.

9. The method according to claim 8, wherein forming the semiconductor layers of the N-type metal oxide thin film transistor and the P-type metal oxide thin film transistor comprises:
forming a first oxide semiconductor thin film;
coating a first layer of photoresist on the first oxide semiconductor thin film;
exposing and developing the first layer of photoresist to form a completely maintained region of the first layer of photoresist and a completely removed region of the first layer of photoresist, wherein the completely maintained region of the first layer of photoresist corresponds to the first semiconductor layer and the completely removed region of the first layer of photoresist corresponds to other regions;
removing a portion of the first oxide semiconductor thin film positioned in the completely removed region of the first layer of photoresist to form the first semiconductor layer and maintaining the first layer of photoresist on the first semiconductor layer;
forming a second oxide semiconductor thin film;
coating a second layer of photoresist on the second oxide semiconductor thin film;
exposing and developing the second layer of photoresist to form a semi-maintained region of the second layer of photoresist and a completely removed region of the second layer of photoresist, wherein the completely removed region of the second layer of photoresist corresponds to the first semiconductor layer, and the semi-maintained region of the second layer of photoresist corresponds to other regions;
removing a portion of the second oxide semiconductor thin film positioned in the completely removed region of the second layer of photoresist;
peeling off all of the remaining first layer of photoresist and second layer of photoresist;
coating a third layer of photoresist on the first oxide semiconductor thin film and the second oxide semiconductor thin film;
exposing and developing the third layer of photoresist to form a completely maintained region of the third layer of photoresist and a completely removed region of the third layer of photoresist, the completely maintained region of the third layer of photoresist corresponding to the first semiconductor layer and the second semiconductor layer, and the completely removed region of the third layer of photoresist corresponding to other regions;
removing a portion of the second oxide semiconductor thin film positioned in the completely removed region of the third layer of photoresist to form the second semiconductor layer; and
peeling off the remaining third layer of photoresist and exposing the first semiconductor layer and the second semiconductor layer.

10. The method according to claim 8, wherein the N-type metal oxide thin film transistor uses a semiconductor material comprising IGZO, IZO or ZON.

11. The method according to claim 8, wherein the P-type metal oxide thin film transistor uses a semiconductor material comprising CuO or SnO.

12. An array substrate, comprising the complementary thin film transistor as claimed in claim 1.

13. A display device, comprising the array substrate as claimed in claim 12.

14. The complementary thin film transistor according to claim 2, wherein the N-type metal oxide thin film transistor uses a semiconductor material comprising IGZO, IZO or ZON.

15. The complementary thin film transistor according to claim 2, wherein the P-type metal oxide thin film transistor uses a semiconductor material comprising CuO or SnO.

16. The complementary thin film transistor according to claim 3, wherein the N-type metal oxide thin film transistor uses a semiconductor material comprising IGZO, IZO, or ZON.

* * * * *